(12) United States Patent
Lienau

(10) Patent No.: US 7,411,803 B1
(45) Date of Patent: Aug. 12, 2008

(54) RESISTIVE COUPLED HALL EFFECT SENSOR

(76) Inventor: Richard Lienau, HC 74 Box 19Z, Pecos, NM (US) 87552

( * ) Notice: Subject to any disclaimer, the term of this patent is extended or adjusted under 35 U.S.C. 154(b) by 0 days.

(21) Appl. No.: 11/679,342

(22) Filed: Feb. 27, 2007

Related U.S. Application Data

(60) Provisional application No. 60/777,302, filed on Feb. 27, 2006.

(51) Int. Cl.
G11C 11/18 (2006.01)
G11C 17/00 (2006.01)
G11C 11/00 (2006.01)

(52) U.S. Cl. .......... 365/9; 365/100; 365/148; 365/158; 365/171; 365/173

(58) Field of Classification Search ....... 365/9, 365/48, 55, 66, 74, 97, 158, 170, 171, 173, 365/100, 148
See application file for complete search history.

(56) References Cited

U.S. PATENT DOCUMENTS

| | | | | |
|---|---|---|---|---|
| 3,037,199 A | * | 5/1962 | Grant | 365/170 |
| 3,418,643 A | * | 12/1968 | Bradley, Jr. | 365/170 |
| 4,035,785 A | * | 7/1977 | Kryder | 365/9 |
| 4,345,317 A | * | 8/1982 | Bobeck | 365/9 |
| 4,791,604 A | | 12/1988 | Lienau et al. | |
| 5,025,416 A | * | 6/1991 | Prinz | 365/170 |
| 5,075,247 A | | 12/1991 | Matthews | |
| 5,295,097 A | * | 3/1994 | Lienau | 365/170 |
| 5,329,480 A | | 7/1994 | Wu et al. | |
| 5,477,482 A | | 12/1995 | Prinz | |
| 5,504,699 A | * | 4/1996 | Goller et al. | 365/48 |
| 5,592,413 A | * | 1/1997 | Spitzer | 365/170 |
| 6,140,139 A | | 10/2000 | Lienau et al. | |
| 6,229,729 B1 | | 5/2001 | Lienau | |
| 6,266,267 B1 | | 7/2001 | Lienau | |
| 6,288,929 B1 | | 9/2001 | Lienau | |
| 6,297,987 B1 | * | 10/2001 | Johnson et al. | 365/158 |
| 6,317,354 B1 | | 11/2001 | Lienau | |
| 6,330,183 B1 | | 12/2001 | Lienau | |
| 6,341,080 B1 | | 1/2002 | Lienau et al. | |
| 6,483,741 B1 | * | 11/2002 | Iwasaki et al. | 365/170 |
| 6,545,908 B1 | | 4/2003 | Lienau | |
| 6,677,877 B2 | * | 1/2004 | Johnson et al. | 365/171 |
| 6,710,624 B2 | | 3/2004 | Lienau | |
| 6,711,069 B2 | | 3/2004 | Lienau | |
| 6,864,711 B2 | | 3/2005 | Lienau | |
| 6,873,546 B2 | | 3/2005 | Lienau | |
| 7,023,727 B2 | | 4/2006 | Lienau et al. | |
| 7,123,050 B2 | | 10/2006 | Lienau | |
| 7,215,570 B2 | * | 5/2007 | Johnson | 365/170 |

* cited by examiner

*Primary Examiner*—Trong Phan
(74) *Attorney, Agent, or Firm*—Advantia Law Group; Michael W. Starkweather; Jason P. Webb

(57) ABSTRACT

A memory device. There is a hall effect device, a current source in electrical communication with the hall effect device, a current drain in electrical communication with the hall effect device, a first sensor arm in electrical communication with the hall effect device and current drain, and a second sensor arm in electrical communication with the hall effect device and current drain. The second sensor arm has a higher resistance than the first sensor arm. There is a voltage measurement module in electrical communication with the current drain and configured to provide a signal based on the voltage in the current drain.

11 Claims, 4 Drawing Sheets

RESISTIVE COUPLED HALL EFFECT SENSOR

CROSS-REFERENCE TO RELATED APPLICATIONS

This invention claims priority, under 35 U.S.C. § 120, to the U.S. Provisional Patent Application No. 60/777,302 to Richard Lienau filed on Feb. 27, 2006, which is incorporated by reference herein.

BACKGROUND OF THE INVENTION

1. Field of the Invention

The present invention relates to Hall Effect sensors, specifically to resistive coupled Hall Effect sensors.

2. Description of the Related Art

Computer science engineering has produced an ever increasing data processing requirement, demanding faster and denser random access memory to keep pace with improved CPU speed and output. Random access memory (RAM) for computers has typically been constructed from capacitors.

There have been attempts to provide RAM through magnetic elements. Magnetic elements enable the memory the advantage of being highly reliable, nonvolatile in the event of power loss, and an infinite lifetime under use. However, magnetic ferrite memory elements eventually were replaced by planar arrays of semiconductors; which is much less expensive to manufacture, quicker in operation and more compact in design. Some efforts have been made in using semi-conductors to utilize the Hall Effect in memory devices.

The Hall Effect is an electrostatic phenomenon whereby a conductor carrying an electric current perpendicular to an applied magnetic field develops a voltage gradient which is transverse to both the current and the magnetic field. This principle has been applied in many electromagnetic devices, including those devices to produce field effect transistors (FETs). Moreover, FETs have been used to create digital memory devices, such as a Hall Effect ferromagnetic non-volatile random access memory cell. A Hall Effect ferromagnetic non-volatile random access memory cell comprises a Hall Effect sensor adjacent to a ferromagnetic bit which is surrounded by a drive coil. The drive coil is electrically connected to a drive circuit, and when provided with an appropriate current creates a residual magnetic field in the ferromagnetic bit, the polarity of which determines the memory status of the cell.

The Hall Effect sensor is a transducer that varies its output voltage in response to changes in magnetic field density and/or polarity. Hall Effect sensors are used in proximity switching, positioning, speed detection, and current sensing applications. In its simplest form, the sensor operates as an analog transducer, directly returning a voltage. The voltage is proportional to the current flowing through the conductor, and the flux density or magnetic induction perpendicular to the conductor. With a known magnetic field, its distance from the Hall plate can be determined. Using groups of sensors, the relative position of the magnet can also be deduced. Electricity carried through a conductor will produce a magnetic field that varies with a current, and a Hall sensor can be used to measure the current without interrupting the circuit.

Innovations in computer science technology have moved toward faster, more reliable, and smaller memory storage devices that apply the Hall Effect. Some improvements have been made in the field. Examples include but are not limited to the references described below, which references are incorporated by reference herein:

U.S. Pat. No. 5,075,247, issued to Matthews, discloses a non-volatile, static magnetic memory device, whose operation is based on the Hall Effect. The device includes a magnetic patch which stores data in the form of a magnetic field, a semiconductor Hall bar and a pair of integrally-formed bipolar transistors used for amplifying and buffering the Hall voltage produced along the Hall bar. Current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. A system of current carrying conductors is employed for writing data to individual magnetic patches.

U.S. Pat. No. 5,295,097, issued to Lienau, discloses a non-volatile random access memory that is disclosed having a substrate carrying separate magnetically polarizable domains each surrounded by a full write loop member and arranged to penetrate the Hall channel of a dual drain FET with its residual magnetic field. The domains are organized in word rows and bit columns, are each written to by a single full write current through the surrounding loop member and each read by a comparator connected to the FET drains. The memory can be fabricated in a variety of forms.

U.S. Pat. No. 5,329,480, issued to Wu et al., discloses a nonvolatile magnetic random access memory that can be achieved by an array of magnet-Hall effect (M-H) elements. The storage function is realized with a rectangular thin-film ferromagnetic material having an in-plane, uniaxial anisotropy and inplane bipolar remanent magnetization states. The thin-film magnetic element is magnetized by a local applied field, whose direction is used to form either a "0" or "1" state. The element remains in the "0" or "1" state until a switching field is applied to change its state. The stored information is detected by a Hall-effect sensor which senses the fringing field from the magnetic storage element. The circuit design for addressing each cell includes transistor switches for providing a current of selected polarity to store a binary digit through a separate conductor overlying the magnetic element of the cell. To read out a stored binary digit, transistor switches are employed to provide a current through a row of Hall-effect sensors connected in series and enabling a differential voltage amplifier connected to all Hall-effect sensors of a column in series. To avoid read-out voltage errors due to shunt currents through resistive loads of the Hall-effect sensors of other cells in the same column, at least one transistor switch is provided between every pair of adjacent cells in every row which are not turned on except in the row of the selected cell.

U.S. Pat. No. 6,140,139, issued to Lienau et al., discloses a Hall Effect ferromagnetic non-volatile random access memory cell comprising a Hall effect sensor adjacent to a ferromagnetic bit which is surrounded by a drive coil. The coil is electrically connected to a drive circuit, and when provided with an appropriate current creates a residual magnetic field in the ferromagnetic bit, the polarity of which determines the memory status of the cell. The Hall Effect sensor is electrically connected via four conductors to a voltage source, ground, and two read sense comparator lines for comparing the voltage output to determine the memory status of the cell. The read and write circuits are arranged in a matrix of bit columns and byte rows. A method for manufacturing said Hall Effect ferromagnetic non-volatile random access memory cell.

U.S. Pat. No. 6,288,929, issued to Lienau, discloses a nonvolatile RAM device that is disclosed which utilizes a plurality of ferromagnetic bits each surrounded by a coil of a write line for directing the remnant polarity thereof is disclosed. The direction of magnetic remnance in each bit is dictated by the direction of a current induced into write line. Further, a magneto sensor comprising a magneto resistor coupled to a pair of collectors that is placed approximate to each bit. The magneto resistor is coupled to a control circuit for receiving current. The current passing across magneto resistor is biased in a direction either right or left of the original current flow direction. The collectors are coupled to a pair of sense lines, which are in turn, coupled to a voltage differential amplifier. The collector in the direction of biased current flow, will receive a greater number of electrons than the other collector, and therefore have a greater negative charge. This voltage differential is conducted through the sense lines to the voltage differential amplifier, where it is amplified and detected.

U.S. Pat. No. 6,330,183, issued to Lienau, discloses a nonvolatile ferromagnetic RAM device which is capable of reading the data stored in each magnet quickly and efficiently utilizing a minimal number of components. Specifically there is a nonvolatile ferromagnetic RAM which is capable of reading the data stored in each magnetic bit. The ferromagnetic memory cell, comprising of a base that is oriented in a horizontal plane. There is also a bit, made of a ferromagnetic material, having: a height that is oriented perpendicular to the horizontal plane of the base, and a polarity that can be directed along the height. Additionally, there is a sense line, positioned proximate the bit sufficient to detect the directed polarity of the bit; and a write line, positioned proximate the bit sufficient to direct the polarity of the bit. Additionally, there is a detector, coupled to the sense line; and a sample drive line, positioned proximate the bit to transmit an electric pulse that will increase the directed polarity of the bit sufficient to induce a wave into the sense line that can be detected by the detector.

Other innovations in the art include U.S. Pat. Nos. 6,229,729, 6,266,267, 6,317,354, 6,545,908, 6,710,624, 6,711,069, 6,864,711, 6,873,546, 7,123,050, issued to Lienau; 4,791,604 issued to Lienau, et al; 6,341,080, issued to Lienau, et al; and 7,023,727 issued to Lienau, et al, each of which is incorporated herein by reference.

The inventions heretofore known suffer from a number of disadvantages which include being unreliable, inconsistent, slow, and expensive.

What is needed is a memory device that solves one or more of the problems described herein and/or one or more problems that may come to the attention of one skilled in the art upon becoming familiar with this specification.

SUMMARY OF THE INVENTION

The present invention has been developed in response to the present state of the art, and in particular, in response to the problems and needs in the art that have not yet been fully solved by currently available memory devices employing a hall effect sensor. Accordingly, the present invention has been developed to provide an improved memory device using a hall effect sensor.

A memory device is provided including: a hall effect device configured to experience the hall effect when exposed to a magnetic field while carrying a current, the hall effect device having a first current portion, a second current portion, a first effect portion and a second effect portion, wherein when current flows through the first current portion and the second current portion while exposed to a magnetic field the first effect portion and the second effect portion experience a voltage differential; a current source in electrical communication with the first current portion and configured to allow current to flow therethrough; a current drain in electrical communication with the second current portion and configured to allow current to flow therethrough; a first sensor arm in electrical communication with the first effect portion and the current drain through a first resistive portion, configured to carry a signal from the second effect portion to the current drain through the first resistive portion; a second sensor arm in electrical communication with the second effect portion and the current drain through a second resistive portion, configured to carry a signal from the second effect portion to the current drain through the second resistive portion, wherein the second resistive portion has a higher resistance than the first resistive portion; and a voltage measurement module in electrical communication with the current drain and configured to provide a signal based on the voltage in the current drain.

A high aspect-ratio magnetic source may be included, configured to produce a magnetic field on the hall effect device, wherein the magnetic field is perpendicular to the hall effect device. The hall effect device may be in the shape of a four-armed cross. The second resistive portion may be a discrete resistor.

In one embodiment, the voltage measurement module may be a Schmitt trigger device, configured to provide no signal when the input voltage is below a specific level and to provide a signal predetermined strength when the input voltage is above a specific level. In another embodiment the voltage measurement module may be a voltage comparator device.

The memory device may further include a ground in electrical communication with the current source. A power supply may also be included in electrical communication with the current drain.

A method for detecting the orientation of a magnetic field is also provided including: providing a hall effect device exposed to the magnetic field, the hall effect device including a current source, a current drain, a first sensor portion and a second sensor portion; providing a first resistive portion in electrical communication with the first sensor portion and with the current drain; providing a second resistive portion in electrical communication with the second sensor portion and with the current drain, wherein the second resistive portion has a higher resistance than the first resistive portion; impressing a potential between the current source and the current drain producing a first signal in the first sensor portion or a second signal in the second sensor portion, depending on the polarity of the magnetic field, wherein the second signal is a higher strength than the first signal; sensing the signal with a voltage measurement module, wherein a lower signal represents a polarity in a first direction and a higher signal represents a polarity in the opposite direction.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order for the advantages of the invention to be readily understood, a more particular description of the invention briefly described above will be rendered by reference to specific embodiments that are illustrated in the appended drawing(s). Understanding that these drawing(s) depict only typical embodiments of the invention and are not therefore to be considered to be limiting of its scope, the invention will be described and explained with additional specificity and detail through the use of the accompanying drawing(s), in which.

DETAILED DESCRIPTION OF THE INVENTION

Figure 1:
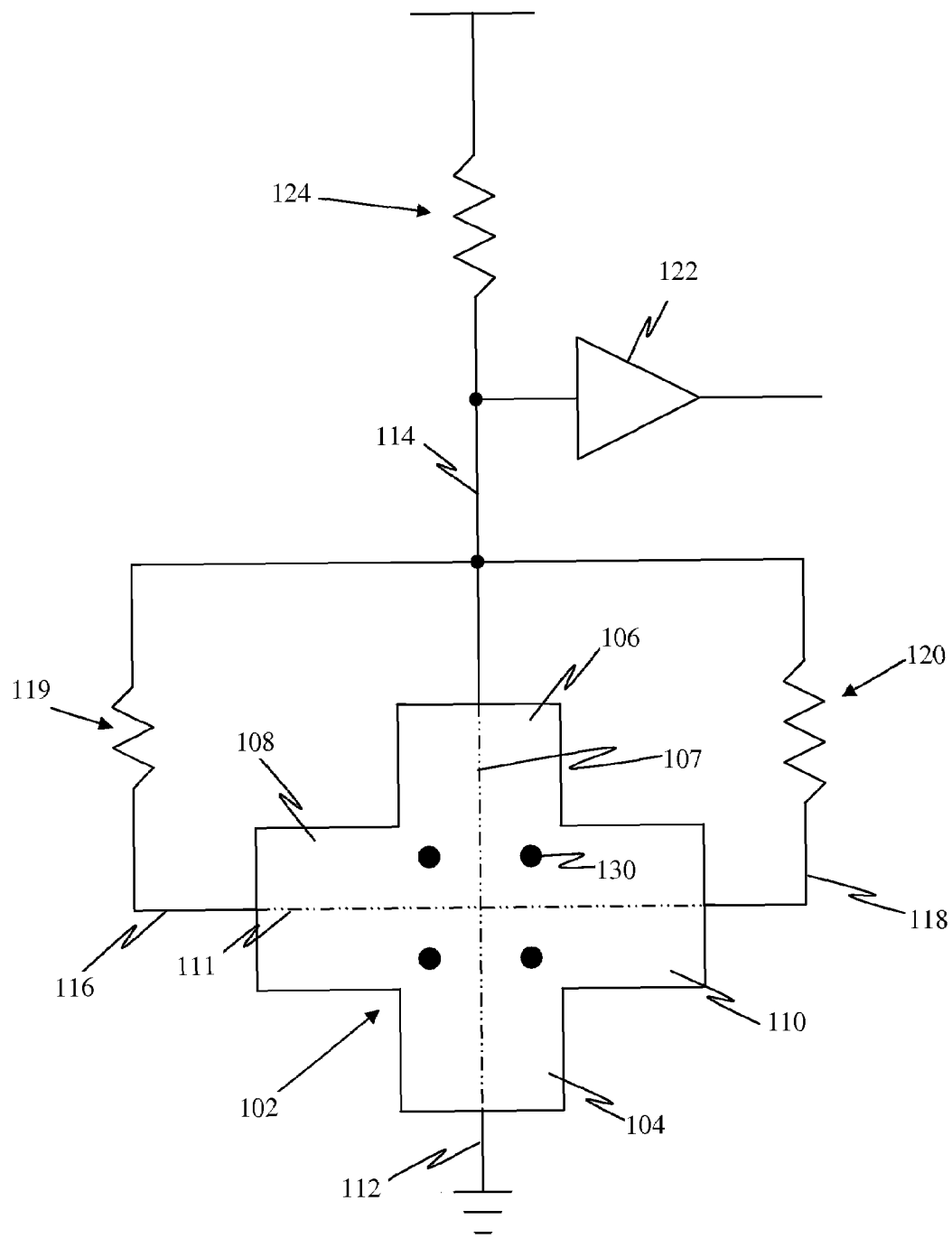
FIG. 1 illustrates a memory device according to one embodiment of the invention.

For the purposes of promoting an understanding of the principles of the invention, reference will now be made to the exemplary embodiments illustrated in the drawing(s), and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Reference throughout this specification to "one embodiment," "an embodiment," or similar language means that a particular feature, structure, or characteristic described in connection with the embodiment is included in at least one embodiment of the present invention. Thus, appearances of the phrases "one embodiment," "an embodiment," and similar language throughout this specification may, but do not necessarily, all refer to the same embodiment, different embodiments, or component parts of the same or different illustrated invention. Additionally, reference to the wording "an embodiment," or the like, for two or more features, elements, etc. does not mean that the features are related, dissimilar, the same, etc. The use of the term "an embodiment," or similar wording, is merely a convenient phrase to indicate optional features, which may or may not be part of the invention as claimed.

Each statement of an embodiment is to be considered independent of any other statement of an embodiment despite any use of similar or identical language characterizing each embodiment. Therefore, where one embodiment is identified as "another embodiment," the identified embodiment is independent of any other embodiments characterized by the language "another embodiment." The independent embodiments are considered to be able to be combined in whole or in part one with another as the claims and/or art may direct, either directly or indirectly, implicitly or explicitly.

Finally, the fact that the wording "an embodiment," or the like, does not appear at the beginning of every sentence in the specification, such as is the practice of some practitioners, is merely a convenience for the reader's clarity. However, it is the intention of this application to incorporate by reference the phrasing "an embodiment," and the like, at the beginning of every sentence herein where logically possible and appropriate.

As used herein, "comprising," "including," "containing," "is, are," "characterized by," and grammatical equivalents thereof are inclusive or open-ended terms that do not exclude additional unrecited elements or method steps. "Comprising" is to be interpreted as including the more restrictive terms "consisting of" and "consisting essentially of."

FIG. 1 illustrates a memory according to one embodiment of the invention. The illustrated memory includes a hall effect device 102. The hall effect device may be a conductive or semi-conductive material configured to experience the hall effect when exposed to a magnetic field while a current is flowing therethrough. The hall effect device 102 sits perpendicular to a magnetic field 130, and reacts to the orientation of the magnetic field 130. In FIG. 1, for example, the magnetic field would be oriented such that it would be going into or out of the page.

The hall effect device 102 includes a first current portion 104 on one end and a second current portion 106 on another end of the hall effect device 102. Generally, the first and second current portions are opposite each other along a current axis 107. The first and second current portions 104, 106, respectively, are further configured to allow a current to flow through the hall effect device 102 when a potential is impressed.

The hall effect device 102 further includes a first effect portion 108 and a second effect portion 110. The illustrated first effect portion 108 and second effect portion 110 are opposite one another and disposed along an effect axis 111. The illustrated effect axis 111 is substantially orthogonal to the current axis 107. The first and second effect portions, 108, 110, respectively, are configured to experience a voltage differential when the hall effect device 102 experiences the hall effect.

As an example, the hall effect device 102 may be in the shape of a four-armed cross, with the first and second current portions 104, 106, respectively, comprising two arms of the cross opposite each other. Further, the first and second effect portions 108, 110, respectively, may comprise the remaining two arms of the cross. Alternatively, the hall effect device 102 may be in any shape that provides the first and second current portions, 106 and 104, configured opposite each other to allow current to flow through the hall effect device 102. The alternative shape must also provides the first and second effect portions, 108 and 110 configured along an effect axis 111 to allow a voltage differential across the hall effect device 102. For example, the hall effect device 102 may be configured to be a rectangle, square, circle, diamond, cylinder, or any other shape conducive to experiencing a measurable hall effect.

A current source 112 may be placed in electrical communication with the first current portion 104. The current source 112 is configured to provide a current flow to the first current portion 104. The illustrated current source 112 is connected to an electrical ground and provides a source of electrons.

A current drain 114 may be placed in electrical communication with the second current portion 106 to receive a flow of electrons from the second current portion 106. The illustrated current drain 114 is connected to a power source. Thus, the current source 112 and the current drain 114 allow current to flow through the first current portion 104 and the second current portion 106 of the hall effect device 102. In one embodiment, a resistor 124 may be placed in electrical communication with the current drain 114. The resistor 124 may act as a pull-up resistor to limit current flow through the hall effect device 102.

A first sensor arm 116 is placed in electrical communication with the first effect portion 108 and the current drain 114. In one embodiment, the first sensor arm 116 is a transmission line, such as, a wire or trace made from a conductive or semi-conductive material. The first sensor arm 116 may include a first resistive portion 119. In one embodiment, the first resistive portion 119 may be a resistive element, such as a discrete resistor or any other resistive element placed in between the first effect portion 108 and the current drain 114. In another embodiment, the first resistive portion 119 may be the first sensor arm 116 itself which normally experiences a small resistance that may be substantially identical to resistance throughout the device. In this embodiment, the first resistive portion 119 would have substantially the same resistance as the resistance across the hall effect sensor 102 itself.

A second sensor arm 118 may be placed in electrical communication with the second effect portion 110 and the current drain 114. Similar to the first sensor arm 116, the second sensor arm 118 may be a standard transmission line, wire or trace made of a conductive or semi-conductive material. The second sensor arm 118 may include a second resistive portion 120. The second resistive portion 120 may be a resistive element such as a discrete resistor or other resistive element, or it could be a second sensor arm 118 made of a material having a predetermined resistance. In one embodiment, the second resistive portion 120 is a discrete resistor, mounted between the second effect portion 110 and the current drain 114. The resistive portion 120 has a resistive value greater than the resistive value of the first resistive portion 119.

A voltage measurement module 122 may be disposed in electrical communication with the current drain 114. The voltage measurement module 122 may be configured in such a way as to provide an output signal based on the voltage in the current drain 114. The voltage measurement module 122 may include any method of comparing voltage levels, such as, but not limited to, a Schmitt trigger device or a voltage comparator device. In one embodiment, the voltage measurement module 122 comprises an amplifier circuit and a two-legged Schmitt trigger device. A signal may be provided to the output of the voltage measurement module 122 and amplified through the amplifier circuit. The amplifier circuit provides the amplified signal to the Schmitt trigger device and a signal is generated based on the signal provided by the amplifier circuit.

In operation, the Hall Effect device 102 may be exposed to a magnetic field of a first orientation. A current is impressed from the current source 112 to the current drain 114, causing a current to pass across the Hall Effect device 102. The magnetic field of a first orientation may cause the electrons in the current to gyrate or move toward the first effect portion 108, creating a voltage differential between the first effect portion 108 and the second effect portion 110. The voltage differential causes a first signal to pass through the first sensor arm 116 to the current drain 114 through the first resistive portion 119. The first signal may then run to the input of the voltage measurement module 122. If the first resistive portion is substantially equal to the resistance across the Hall Effect device 102, the first signal that is provided to the input of the voltage measurement module 122 will be a low voltage. The voltage measurement module 122 may be configured to provide an output that is low, or a digital zero for this low voltage signal.

In a second mode of operation, the magnetic field may be in a second orientation, opposite the first orientation. In this case, the current across the hall effect device 102 causes electrons to gyrate or move toward the second effect portion 110, causing a second signal to pass through the second sensor arm 118 to the current drain 114. The second signal is provided to the input of the voltage measurement module 122. The second resistive portion 120 in the second sensor arm 118 may be a higher resistance than the first resistive portion 119 in the first sensor arm 116. This higher resistance causes the second signal that passes to the current drain 114 to be a higher voltage than the first signal that was produced under the first operation example above. The higher second signal causes the voltage measurement module 122 to provide an output that is high or a digital one. Thus, the one or the zero in the voltage measurement module will correlate to the orientation of the magnetic field, a zero being a first orientation and a one being a second orientation in this example.

Figure 2:
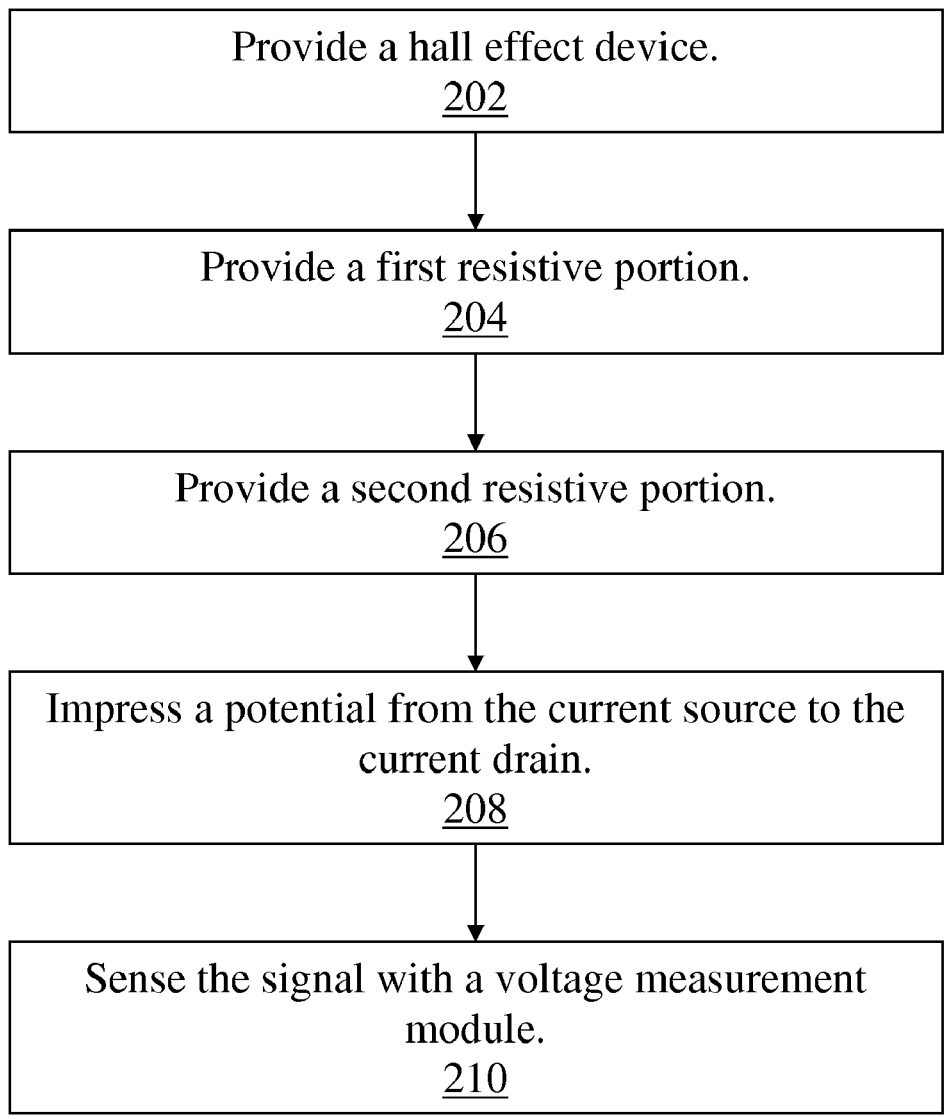
FIG. 2 illustrates a method of detecting the orientation of a magnetic field according to one embodiment of the invention.

FIG. 2 illustrates a method of detecting the orientation of a magnetic field according to one embodiment of the invention. A Hall Effect device exposed to the magnetic field is provided 202. The Hall Effect device may include a current source, a current drain, a first sensor portion and a second sensor portion. For example, the Hall Effect device may be configured in a manner similar to that shown in FIG. 1 and described above. Furthermore, the Hall Effect device may be constructed of any conductive or semi-conductive material.

A first resistive portion may be provided in electrical communication between the first sensor portion and the current drain 204. A second resistive portion may also be provided, the second resistive portion being in electrical communication between the second sensor portion and the current drain 206. The second resistive portion may have a higher resistance than the first resistive portion. A potential may be impressed from the current source to the current drain producing a first signal in the first sensor portion or a second signal in the second sensor portion, depending on the orientation of the magnetic field 208. With the second resistive portion being a higher or greater resistance than the first resistive portion, the second signal may be a higher strength than the first signal. The signal may be sensed with a voltage measurement module, wherein a lower signal represents a polarity in a first direction and a higher signal represents a polarity in the opposite direction 210.

Figure 3:
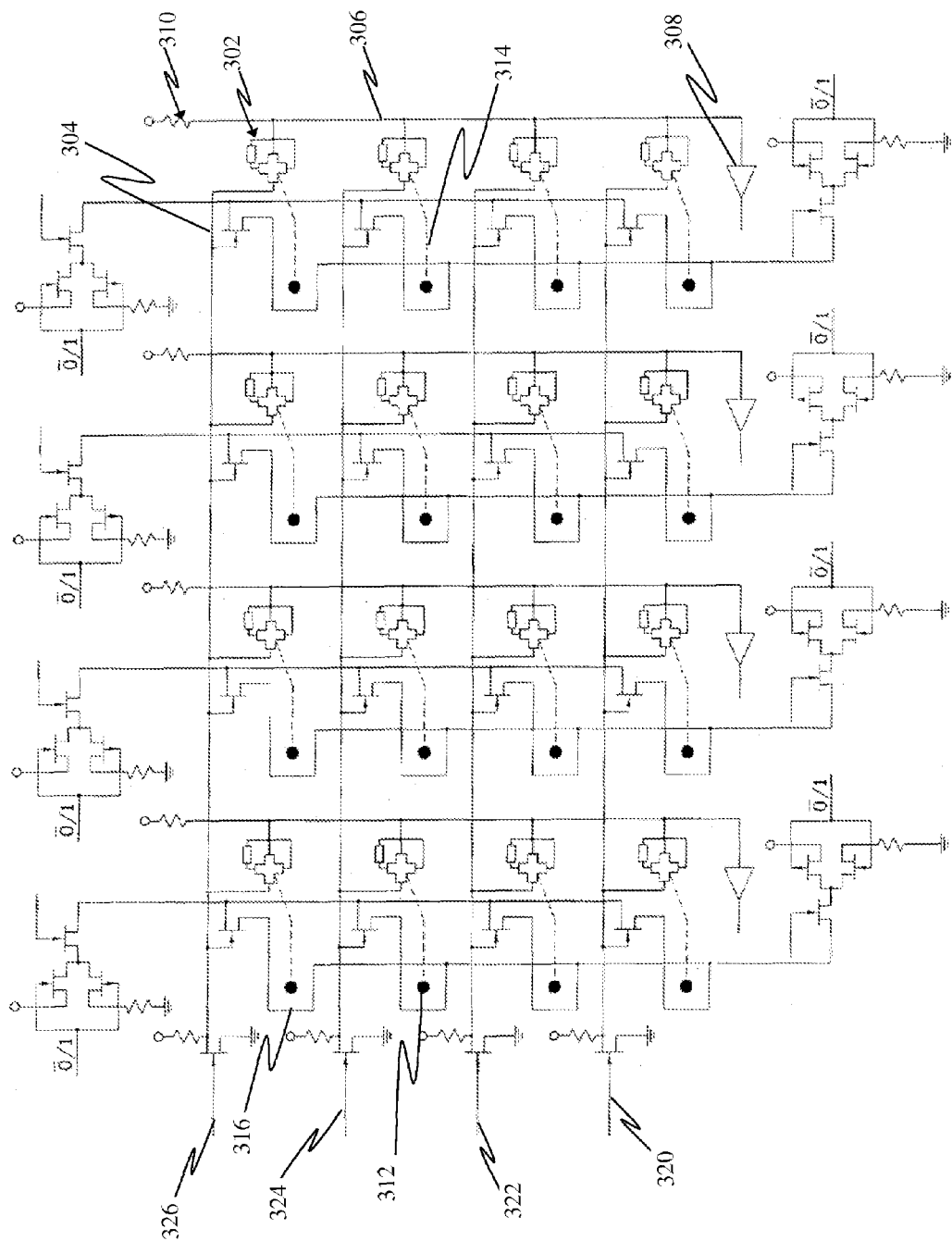
FIG. 3 illustrates a memory array according to one embodiment of the invention.

FIG. 3 illustrates a memory array according to one embodiment of the invention. The illustrated matrix includes a plurality of resistive coupled Hall Effect sensors 302. The resistive coupled Hall Effect sensors 302 are configured in a manner similar to the memory device described in FIG. 1 and its accompanying description. The resistive coupled Hall Effect sensors 302 may be configured in a plurality of byte rows and byte columns such that each resistive coupled Hall Effect sensor 302 represents a specific memory address. A current source 304 is in electrical communication with each resistive coupled Hall Effect sensor 302. A current drain 306 is in electrical communication with each resistive coupled Hall Effect sensor 302 opposite the current source 304, similar to that described in FIG. 1.

The current source 304 and the current drain 306 may be common for more than one resistive coupled Hall Effect sensor 302. In one embodiment, the current source 304 is common to each resistive coupled Hall Effect sensor 302 in the same byte row. For example, the current source 304 may be common for each resistive coupled Hall Effect sensor 302 in the top row of FIG. 3. The current drain 306 may be common for each resistive coupled Hall Effect sensor 302 in the same byte column. For example, the current drain 306 may be common for each resistive coupled Hall Effect sensor 302 in the last column of FIG. 3. The current drain 306 may also be in electrical communication with a voltage measurement module 308. The current drain 306 may further be in electrical communication with a pull-up resistor 310.

A high aspect-ratio magnetic source 312 may be disposed in proximity to each resistive coupled Hall Effect sensor 302 such that a magnetic field 314 may affect the resistive coupled Hall Effect sensor 302 to create the Hall Effect as described above. The polarity of the magnetic field 314 represents a one or a zero for that specific location in the matrix address, depending on the orientation of the magnetic field 314.

Each high aspect-ratio magnetic source 312 may be in electrical communication to a write coil 316. The write coil 316 is used to orient the magnetic field 314 for each high aspect-ratio magnetic source 312. Thus, digital information may be stored into the memory array. In addition, FIG. 3 further illustrates the circuits each comprising three FETs and one resistor connected to the 0/1 terminal.

In operation, the matrix may be set into a read or write mode by a read/write switch 320, 322, 324, 326. The read/write switch's 326 condition is either on or off depending on whether the matrix is in a read or a write mode. In the read mode, a current is impressed across the resistive coupled Hall Effect sensor 302 through the current source 304 and the current drain 306. Depending on the orientation of the magnetic field 314, a signal is produced in current drain 306 and carried to the voltage measurement module 308 associated with each byte column.

When the matrix is in the write mode, a voltage may be impressed in the write coil 316. The impressed voltage causes the high aspect-ratio magnetic source 312 to carry a magnetic field of a specific polarity. The polarity is stored in the high aspect-ratio magnetic source and can be read during the read mode as described above.

Figure 4:
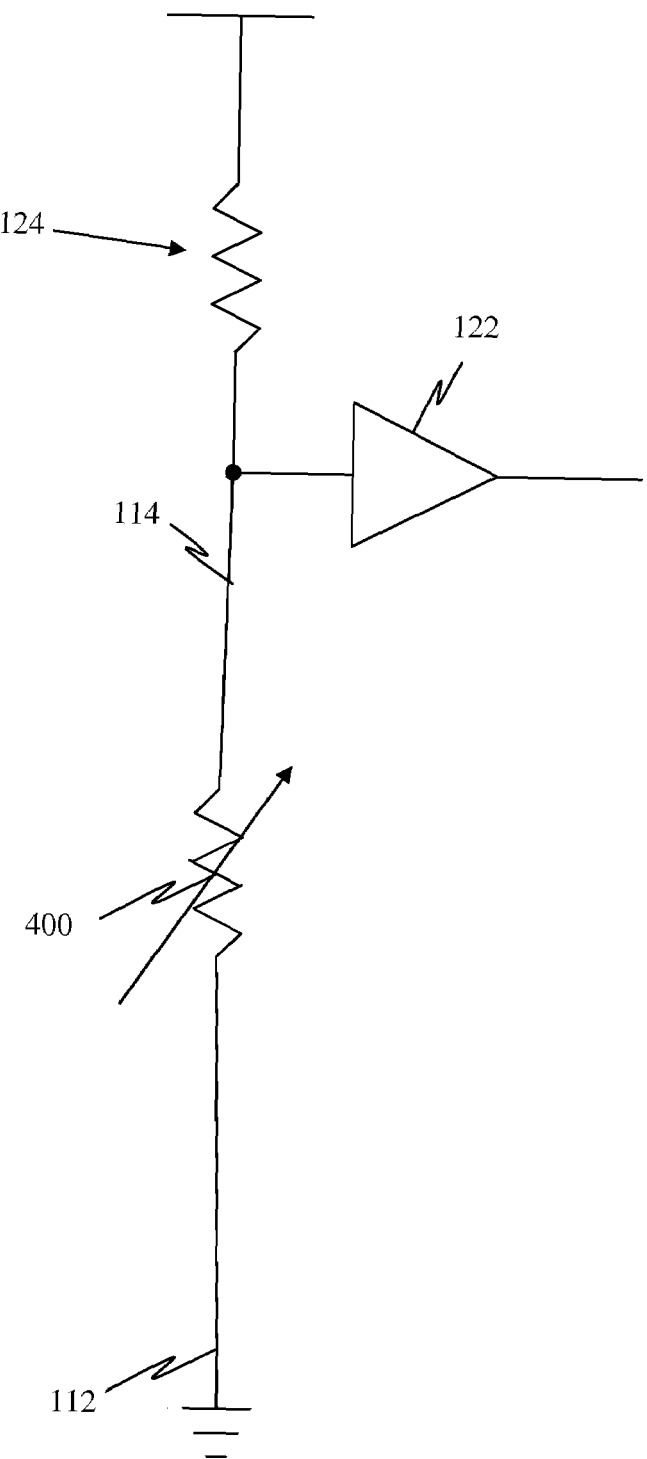
FIG. 4 illustrates how, in one embodiment of the invention, the memory device may be illustrated to function similar to a variable voltage divider.

FIG. 4 illustrates how, in one embodiment of the invention, the memory device may be illustrated to function similar to a variable voltage divider. In particular, those portions of FIG. 1 not also shown in FIG. 4 may be conceptually replaced by a variable resistor 400 in communication with the current source 112 and current drain 114. The variable resistor 400 has an effective resistance that varies under different magnetic fields.

Accordingly, wherein the functional resistance of the variable resistor 400 may be altered by varying the magnetic field strength and/or polarity, the voltage experienced between the variable resistor 400 and the pull-up resistor 124 varies as the magnetic field varies. In this way, the voltage measurement module 122 may measure a change in voltage along the current drain 114 between the pull up resistor 124 and the effective variable resistor 400, thus providing information about the magnetic field. Wherein the magnetic field may be transitioned between two states, each state producing a different effective resistance in the variable resistor 400, the magnetic field state may be known by using an appropriate voltage measurement module 122 tuned to differentiate between the associated voltages.

It is understood that the above-described embodiments are only illustrative of the application of the principles of the present invention. The present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

Thus, while the present invention has been fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. A memory device, comprising:
  a hall effect device, configured to experience the hall effect when exposed to a magnetic field while carrying a current, the hall effect device having a first current portion, a second current portion, a first effect portion and a second effect portion, wherein when current flows through the first current portion and the second current portion while exposed to a magnetic field the first effect portion and the second effect portion experience a voltage differential;
  a current source in electrical communication with the first current portion and configured to allow current to flow therethrough;
  a current drain in electrical communication with the second current portion and configured to allow current to flow therethrough;
  a first sensor arm in electrical communication with the first effect portion and the current drain through a first resistive portion, configured to carry a signal from the second effect portion to the current drain through the first resistive portion;
  a second sensor arm in electrical communication with the second effect portion and the current drain through a second resistive portion, configured to carry a signal from the second effect portion to the current drain through the second resistive portion, wherein the second resistive portion has a higher resistance than the first resistive portion;
  a voltage measurement module in electrical communication with the current drain and configured to provide a signal based on the voltage in the current drain.

2. The memory device of claim 1, wherein the hall effect device is in the shape of a broad, four-armed cross.

3. The memory device of claim 1, wherein the second resistive portion includes a discrete resistor.

4. The memory device of claim 1, further comprising a ground in electrical communication with the current source.

5. The memory device of claim 1, further comprising a power supply in electrical communication with the current drain.

6. A memory device, comprising:
  a voltage measurement module including a module input and a module output, configured to provide a predetermined output signal in the module output based on an input signal in the module input;
  a current drain in electrical communication with the module input, configured to allow a current to flow therethrough, wherein a signal is provided to the module input of the voltage measurement module;
  a first sensor arm in electrical communication with the current drain through a first resistive portion and configured to provide a first sensor signal to the current drain;

a second sensor arm in electrical communication with the current drain through a second resistive portion and configured to provide a second sensor signal to the current drain, wherein the second resistive portion has a higher resistance than the first resistive portion so that the second sensor signal is a higher value than the first sensor signal;

a hall effect device, configured to experience the hall effect when exposed to a magnetic field while carrying a current, the hall effect device including a first current portion, a second current portion opposite the first current portion and in electrical communication with the current drain, a first effect portion substantially perpendicular to the first current portion and the second current portion and in electrical communication with the first sensor arm, and a second effect portion opposite the first effect portion and in electrical communication with the second sensor arm, wherein when current flows through the first current portion and the second current portion while exposed to a magnetic field the first effect portion and the second effect portion experience a voltage differential;

an current source in electrical communication with the first current portion of the hall effect device and configured to allow current to flow therethrough.

7. The memory device of claim 6, wherein the hall effect device is in the shape of a four-armed cross.

8. The memory device of claim 6, wherein the second resistive portion includes a discrete resistor.

9. The memory device of claim 6, further comprising a ground in electrical communication with the current source.

10. The memory device of claim 6, further comprising a power supply in electrical communication with the current drain.

11. A method of detecting the orientation of a magnetic field, which comprises:

providing a hall effect device exposed to said magnetic field, the hall effect device including a current source, a current drain, a first sensor portion and a second sensor portion;

providing a first resistive portion in electrical communication with the first sensor portion and with the current drain;

providing a second resistive portion in electrical communication with the second sensor portion and with the current drain, wherein the second resistive portion has a higher resistance than the first resistive portion;

impressing a potential across the current source and the current drain producing a first signal in the first sensor portion or a second signal in the second sensor portion, depending on the polarity of the magnetic field, wherein the second signal is a higher strength than the first signal;

sensing the signal with a voltage measurement module, wherein a lower signal represents an orientation in a first direction and a higher signal represents an orientation in the opposite direction.

* * * * *